United States Patent
Powell et al.

(10) Patent No.: US 11,172,150 B1
(45) Date of Patent: Nov. 9, 2021

(54) DUAL RAMP PIXEL READOUT

(71) Applicant: SHENZHEN GOODIX TECHNOLOGY CO., LTD., Shenzhen (CN)

(72) Inventors: Matthew Powell, San Diego, CA (US); Mohamed Elsayed, San Diego, CA (US)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/852,415

(22) Filed: Apr. 18, 2020

(51) Int. Cl.
*H04N 5/363* (2011.01)
*H04N 5/374* (2011.01)

(52) U.S. Cl.
CPC ........... *H04N 5/363* (2013.01); *H04N 5/3742* (2013.01)

(58) Field of Classification Search
CPC .......... H03M 1/00–645; H04N 5/3355; H04N 5/3745; H04N 5/37455; H04N 5/378; H04N 5/363; H04N 5/3742
USPC ....................................................... 348/308
See application file for complete search history.

(56) References Cited

U.S. PATENT DOCUMENTS

| 2012/0133808 | A1 | 5/2012 | Park et al. | |
|---|---|---|---|---|
| 2017/0237917 | A1* | 8/2017 | Sato | H04N 5/363 |
| | | | | 348/308 |
| 2018/0288349 | A1* | 10/2018 | Yoshida | H03M 1/56 |
| 2018/0323795 | A1* | 11/2018 | Xhakoni | H04N 5/365 |

FOREIGN PATENT DOCUMENTS

| CN | 106470322 A | 3/2017 |
|---|---|---|
| CN | 108293100 A | 7/2018 |
| CN | 108352840 A | 7/2018 |
| CN | 109040632 A | 12/2018 |
| CN | 109429023 A | 3/2019 |

\* cited by examiner

*Primary Examiner* — Nhan T Tran
*Assistant Examiner* — Chan T Nguyen
(74) *Attorney, Agent, or Firm* — Kilpatrick Townsend & Stockton LLP

(57) ABSTRACT

An image sensor includes a plurality of pixel columns and a plurality of readout circuits. Each readout circuit is coupled to one of the plurality of pixel columns and includes an ADC for receiving a first analog signal of a pixel in a reset conversion phase and a second analog signal of the pixel in a signal measurement phase, a dual-ramp generator for generating a first ramp having a first ramp rate and a second ramp having a second ramp rate greater than the first ramp rate and providing the first ramp to the readout circuits in the reset conversion phase and the second ramp to the plurality of readout circuits in the signal measurement phase, and a controller configured to provide control signals to the readout circuits and the dual-ramp generator.

20 Claims, 9 Drawing Sheets

DUAL RAMP PIXEL READOUT

TECHNICAL FIELD OF THE INVENTION

The present invention relates to CMOS image sensors, and more particularly, to an image sensor and method for operating thereof using a dual-ramp generator.

BACKGROUND OF THE INVENTION

Modern image sensors with high pixel count attempt to achieve high frame rate, low read noise and high dynamic range with minimal power consumption. The basic function of a modern CMOS image sensor (CIS) is to capture photons that are converted into electrons in a photo diode. These captured electrons are read out by a series of analog-to-digital converters (ADCs) included as part of the image sensor. In particular, it is very challenging in a single image frame to readout pixels that have received a large number of electrons at the same time as achieving low noise readout for pixels that have received a small number of electrons. This is defined as the dynamic range of the image sensor, which is the maximum electrons that can be read out divided by the number of captured electrons at which the read noise is equal to the signal, i.e., the number of electrons in that pixel. This is one of the most important specifications for an image sensor as achieving a higher dynamic range leads to better image quality.

Pixels of an image sensor are arranged in rows and columns. Pixels in the same column are connected to a common readout circuit. A pixel includes a photodiode that receives a number of photons, and the photons are converted into an electric signal indicative of an intensity of light detected by the photodiode. Many methods and circuits have been developed to reduce noise caused by the readout circuit.

BRIEF SUMMARY OF THE INVENTION

In one aspect, the inventive concept relates to image sensors that use a multi-slope ramp scheme for reading out signals from the image sensors. Corresponding methods of reading out the signals from the image sensors are also disclosed.

According to an aspect, the inventive concept relates to images sensors that perform sequential ramps for reading out signals from the image sensors in the reset conversion phase and in the signal measurement phase.

According to another aspect, the inventive concept relates to images sensors that perform two consecutive ramps for reading out signals from the image sensors in the reset conversion phase and in the signal measurement phase.

According to yet another aspect, the inventive concept relates to images sensors that perform two ramps in parallel in the reset phase and in the signal measurement phase. In some embodiments, it is necessary to make a rough estimate of the pixel output voltage before starting either ramp. Since the pixel output requires some time to settle, and the signal has to settle to a level much more precise than what is required for this coarse decision, this is possible to do without adding time to the total conversion time, but adds complexity to the comparator to perform this operation and select one of two ramp inputs. In theory, this may save total conversion time however. In either implementation, it is still necessary to perform two reset conversions and they must be performed in series since it is not possible to know ahead of time which conversions will be needed to construct the final ADC output.

According to yet another aspect, the inventive concept relates to images sensors that perform the reset conversions in parallel as well by adding a second comparator per ADC, so that the conversion can be captured with both ramp rates at the same time during both the reset conversion phase and the signal conversion phase. This embodiment trades off additional area and power consumption for the ADC at the benefit of slightly improved total pixel conversion time. In one embodiment, to save power and silicon area, the second comparator capturing the fast ramp, which is also associated with measuring larger signal from the pixel, may be scaled to smaller area and power compared to the other comparator. This will increase noise, but the shot noise of the signal from the pixel will still be larger in most cases.

Embodiments of the present invention provide an integrated-circuit image sensor. The image sensor includes a plurality of pixels arranged in a pixel array including a plurality of pixel columns, a plurality of readout circuits, each one of the readout circuits coupled to one of the plurality of pixel columns, each one of the readout circuits comprising an analog-to-digital converter (ADC) configured to receive a first analog signal of a pixel in a reset conversion phase and a second analog signal of the pixel in a signal measurement phase, a dual-ramp generator configured to generate a first ramp having a first ramp rate and a second ramp having a second ramp rate greater than the first ramp rate and provide the first ramp to the plurality of readout circuits in the reset conversion phase and the second ramp to the plurality of readout circuits in the signal measurement phase, and a controller configured to provide control signals to the readout circuits and the dual-ramp generator. The ADC sequentially provides a first digital pixel value representative of the first analog signal based on the first ramp, a second digital pixel value representative of the first analog signal based on the second ramp in the reset conversion phase, a third digital pixel value representative of the second analog signal based on the first ramp, and a fourth digital pixel value representative of the second analog signal based on the second ramp in the signal measurement phase. In some embodiments, the number of readout circuits is lower than the number of columns so that the readout circuits are employed more than one time to readout the columns.

In some embodiments, the inventive concept relates to a method of operating an integrated-circuit image sensor using a dual-ramp generator. The integrated-circuit image sensor includes a pixel array containing a plurality of columns of pixels and a plurality of rows of pixels. The method includes reading out a first analog signal of a pixel in a reset conversion phase, performing a first analog-to-digital conversion of the first analog signal with a first ramp having a first ramp rate to obtain a first digital pixel value representing the first analog signal, and performing a second analog-to-digital conversion of the first analog signal with a second ramp having a second ramp rate greater than the first ramp rate to obtain a second digital pixel value representing the first analog signal. The method also includes reading out a second analog signal of the pixel in a signal measurement phase, performing a third analog-to-digital conversion of the second analog signal with the first ramp to obtain a third digital pixel value representing the second analog signal, performing a fourth analog-to-digital conversion of the second analog signal with the second ramp to obtain a fourth digital pixel value representing the second analog signal, determining whether or not the third digital pixel value is within a predetermined range of the first ramp to obtain a determination result, and outputting a digital word in response to the determination result.

In some embodiments, the method may further include, after obtaining the determination result, determining a first difference between the third digital pixel value and the first digital pixel value, the first difference being representative of a low-light level of the pixel, and the digital word being the low-light level of the pixel when the third digital pixel value is determined to be within the predetermined range of the first ramp. Alternatively, the method may include determining a second difference between the fourth digital pixel value and the second digital pixel value, the second difference being representative of a bright-light level of the pixel, and the digital word being the bright-light level of the pixel when the third digital pixel value is determined not to be within the predetermined range of the first ramp.

In some embodiments, the method may further include adjusting the digital word by an adjustment factor when the digital word is representative of the bright-light level of the pixel. The adjustment factor is a ratio between the second ramp rate and the first ramp rate.

Embodiments also provide an integrated-circuit image sensor. The image sensor includes a plurality of pixels arranged in a pixel array arranged in a plurality of pixel columns and a plurality of readout circuits. Each one of the readout circuits is coupled to one of the plurality of pixel columns and includes an analog-to-digital converter (ADC) configured to receive a first analog signal of a pixel in a reset conversion phase and a second analog signal of the pixel in a signal measurement phase. The image sensor also includes a dual-ramp generator configured to generate a first ramp having a first ramp rate and a second ramp having a second ramp rate greater than the first ramp rate and provide the first ramp to the plurality of readout circuits in the reset conversion phase and the second ramp to the plurality of readout circuits in the signal measurement phase, and a controller configured to provide control signals to the readout circuits and the dual-ramp generator. The ADC sequentially provides a first digital pixel value representative of the first analog signal based on the first ramp, a second digital pixel value representative of the first analog signal based on the second ramp in the reset conversion phase, a third digital pixel value representative of the second analog signal based on the first ramp, and a fourth digital pixel value representative of the second analog signal based on the second ramp in the signal measurement phase.

In some embodiments, the controller is further configured to determine that the third digital pixel value is within a predetermined range of the first ramp, compute a first difference between the first digital pixel value and the third digital pixel value when the third digital pixel value is determined to be within the predetermined range of the first ramp, and output the first difference as a first digital word that is representative of a low-light level of the pixel.

In some embodiments, the controller is further configured to compute a second difference between the fourth digital pixel value and the second digital pixel value when the third digital pixel value is determined not to be within the predetermined range of the first ramp, and output the second difference as a second digital word, which is representative of a bright-light level of the pixel. In some embodiments, the controller is further configured to adjust the second digital word by an adjustment factor.

By providing two consecutive ramps during both the reset conversion phase and the signal conversion phase (signal measurement phase), where the first ramp is slow and has a limited swing while the second ramp is fast and covers the full range of pixel outputs, significant relaxation of the ADC read noise without any significant impact to the total noise of the measurement can be achieved.

These and other embodiments of the present invention along many of its advantages and features are described in more detail in conjunction with the text below and attached figures.

BRIEF DESCRIPTION OF THE DRAWINGS

The drawings are not necessarily to scale, emphasis is placed on illustrating the principles of the inventive concepts.

DETAILED DESCRIPTION OF THE INVENTION

Figure 1:
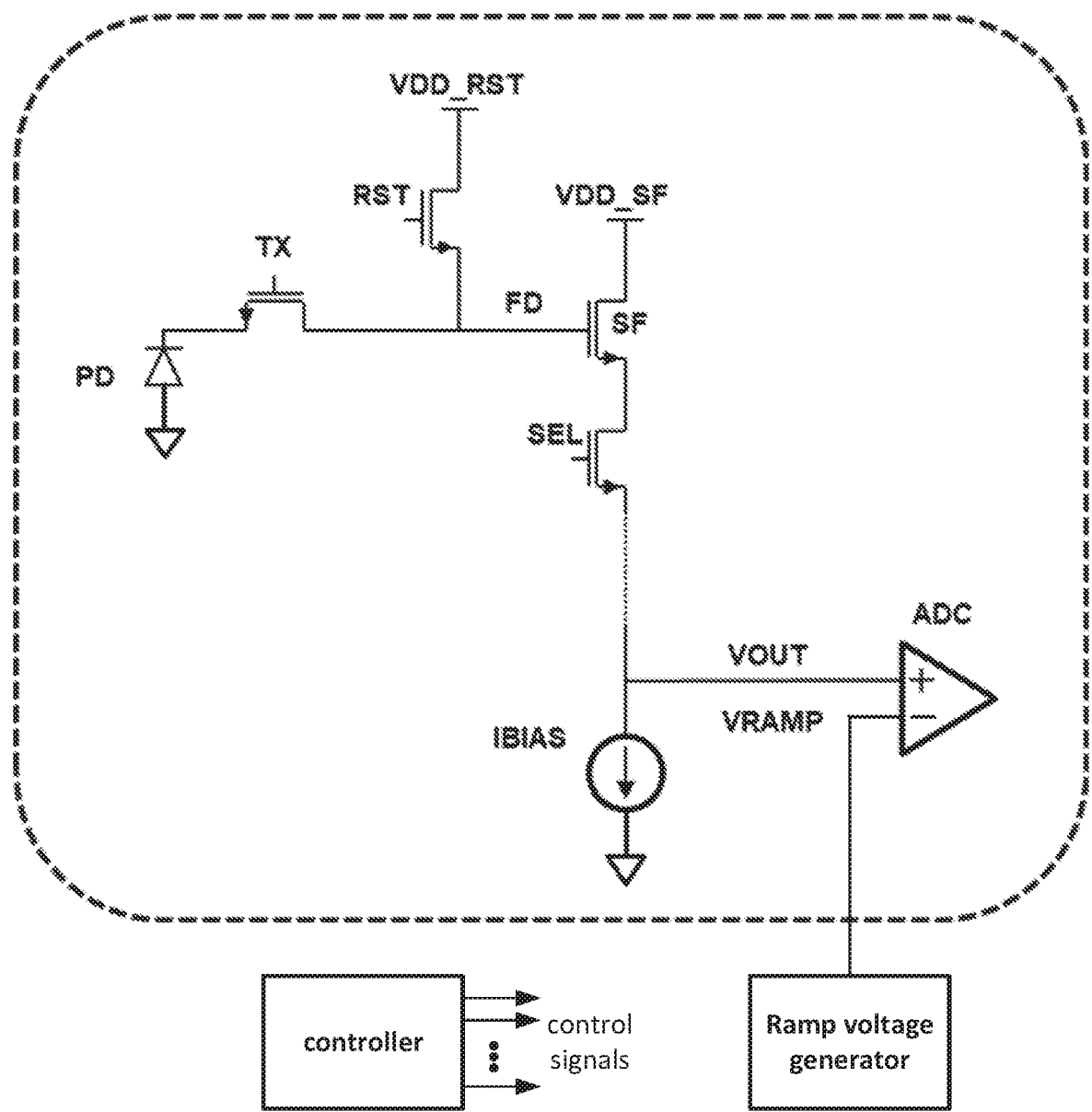
FIG. 1 is a block diagram of a pixel coupled to an example readout circuit according to an embodiment of the present disclosure.

FIG. 1 is a block diagram of a pixel coupled to an example readout circuit according to an embodiment of the present disclosure. Referring to FIG. 1, the pixel includes a photodiode (or a photosensitive element) PD, a transfer transistor TX coupled to the photodiode PD, a source follower SF having a gate coupled to the transfer transistor TX, a reset transistor RST coupled to a floating diffusion node FD disposed between the transfer transistor TX and the gate of the source follower SF. The reset transistor RST is configured to charge the floating diffusion node FD to the reset voltage VDD_RST when the reset transistor RST is turned on, thereby resetting the floating diffusion node FD. The photodiode PD may be reset along with the floating diffusion node FD by turning on the transfer transistor TX. The source follower SF has a terminal coupled to the source follower voltage VDD_SF and another terminal coupled to a select transistor SEL. The select transistor SEL has a gate coupled to a row select line (not shown) and is disposed between the source follower SF and a voltage readout line that provides an analog output pixel signal VOUT to an analog-to-digital converter ADC. The select transistor SEL is coupled to a current source IBIAS. In one embodiment, the analog-to-digital converter ADC includes a comparator and a counter and receives a ramp voltage VRAMP from a ramp voltage generator. As used herein, the ramp voltage VRAMP may also be referred to as ramp, ramp signal, or ramp voltage signal. The ramp voltage VRAMP increases with time at a constant rate. Referring to FIG. 1, the readout circuit may also include a controller configured to generate control signals to turn on and off the transfer transistor TX, the reset transistor RST, the source follower SF, and the select transistor SEL. The controller also provides control signals to the ramp voltage generator for controlling the ramp voltage VRAMP during different time intervals in the reset conversion phase and in the signal measurement phase. The ADC, the controller, and the ramp voltage generator will be described in more detail below.

Figure 2:
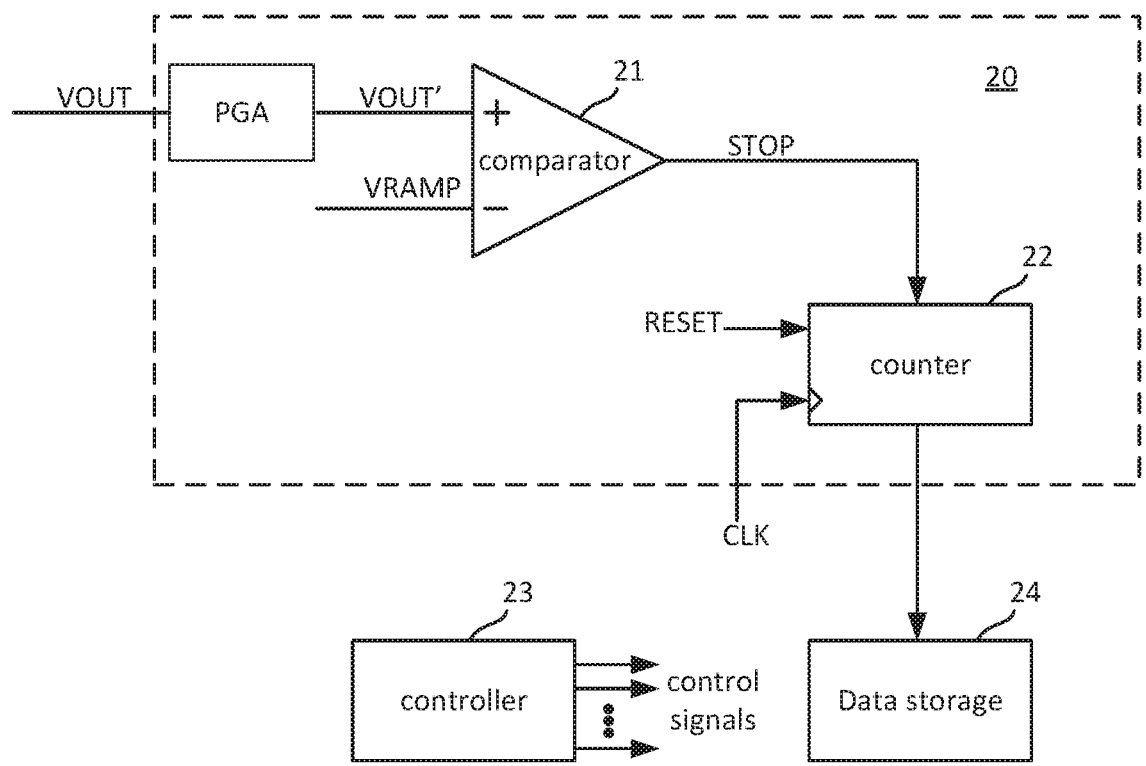
FIG. 2 is a simplified block diagram of an analog-to-digital converter according to an embodiment of the present disclosure.

FIG. 2 is a simplified block diagram of an analog-to-digital converter (ADC) 20 according to an embodiment of the present disclosure. The analog-to-digital converter 20 includes a voltage comparator 21 and a counter 22 coupled to the comparator 21. The counter 22 receives a clock signal CLK and a reset signal RESET. The counter 22 counts in response to the clock signal CLK while the comparator 21 compares the pixel output signal VOUT with the ramp voltage VRAMP. When the ramp voltage VRAMP reaches the level of VOUT, the comparator 21 outputs a comparison signal STOP to the counter 22. In response, the counter 22 stops counting and the count value stored in the counter is a digital word that represents the pixel output signal VOUT. Referring to FIG. 2, a controller 23, in additional to provide control signals to turn on and off the transistors to readout analog signals of pixels of an image sensor, also outputs control signals to latch the count value stored in the counter 22 to a data storage 24, transfer the count value to a processor (not shown) for further processing, and reset the counter 22. In one embodiment, the counter 22 may be a synchronous counter. In another embodiment, the counter 22 may be a binary ripple counter.

In one embodiment, the ADC 20 may further include a programmable gain amplifier (PGA) disposed before the comparator 21, i.e., the PGA is disposed between the pixel output signal VOUT and the comparator and adds a programmable gain to the pixel output signal VOUT prior to providing the amplified (scaled) pixel output signal VOUT' to the comparator 21. The PGA provides the flexibility to increase the ramp rate of the ramp signal VRAMP. The increase in the ramp rate allows additional analog-to-digital conversions that provide the benefit of a reduction in thermal noise from both the ADC and the PGA. It is noted that, while increasing the ramp rate will only effect the noise contribution per conversion from the ADC, that contribution is reduced by the gain from the PGA.

In one embodiment, an ADC architecture in high pixel-count image sensors is a ramp ADC. In a ramp ADC a single linear slope voltage ramp is provided to many ADCs (usually thousands) along with a reference clock (e.g., clock signal CLK). Each ADC contains a comparator to compare the voltage output from the pixel to the ramp voltage. Each ADC also contains a digital circuit (e.g., counter 22) to count clock cycles. Each ADC captures the number of clock cycles from the start of the ramp to the moment that the ramp voltage exceeds the pixel output voltage. The benefit of this architecture is that each of many instances of the ADC only needs to include a simple comparator and a digital counter.

The ramp generator circuit has many more components and considerable power consumption compared to the comparator in each ADC, but only one of them is needed for the entire image sensor so the overall area and power requirement for the ramp generator is a small fraction of the total ADC area and power.

In one embodiment, the number of ADCs is chosen so that some number of rows, or a fraction of rows, of the image sensor can be read out at a single time. In an example embodiment, an image sensor may have 8000 pixels in a single row and 4000 ADCs, each of the ADCs is coupled to a column, thus half of the pixels in a row can be read out at a time. In order to read out a frame, each set of rows, or fraction of rows, is read out sequentially. In the example embodiment with 8000 pixels in a row and 4000 ADCs, the image sensor may have 6000 rows, then 12000 sequential ADC conversions are needed to read out the entire image frame. The frame rate of the sensor is limited by how fast these 12000 sequential conversions can be performed.

An additional common property of high pixel-count image sensors is that an ADC conversion is performed first when the pixel is in a reset state and a second ADC conversion is performed after the electrons are transferred from the photodiode to a small capacitor and converted into a voltage. The signal is considered as the difference between the two ADC conversions. This approach is very beneficial for addressing impairments, such as kT/C noise of the reset conversion, offset in the pixel read out circuit or ADC and 1/f noise in the system. It is generally mandatory in some form for acceptable performance in image sensors targeting read noise performance at the level of 1-3 electrons. The reset phase is initiated by applying a pulse to a reset gate which returns the voltage on a node in the pixel to a reset state. The signal measurement phase is initiated by applying a pulse to a TX gate which transfers electrons from the photodiode to this same node.

One of the properties of the ramp ADC is that the read noise of the ADC, referred to the output pixel voltage, is inversely proportional to the ramp rate. A slower ramp results in lower noise while a faster ramp results in more noise, holding other properties of the ADC constant. It is possible to achieve lower read noise in the ADC without increasing power simply by reducing the ramp rate. However, in order to read out pixels with a large number of electrons, the ramp voltage swing must cover the difference in pixel output voltages between pixels with zero or few electrons vs pixels with large numbers of electrons. A slower ramp means more time required to cover the full voltage output range of the pixel. Since the ADC conversion time cannot be increased without impacting the frame rate, this generally leads to a reduced ramp voltage swing and thus a reduced full scale range of the ADC corresponding to only a fraction of the total possible electrons per pixel. Thus, a single ADC ramp forces a tradeoff between lower read noise and higher full scale, limiting the ability to increase the dynamic range.

One interesting property of image sensors is that the photon arrival rate is a Poisson process which has a shot noise with power equal to the average photon arrival rate. The same is true of the captured electrons. The shot noise in voltage is equivalent to the square root of electrons. The significance of this is that the read noise of the ADC can be relaxed substantially for pixels with higher numbers of captured electrons. For example, for an ADC with 1 electron of read noise, the shot noise and the read noise are equal for pixels with an average electron capture rate of 1 electron per exposure. But for pixels with an average electrons capture rate of 100 electrons, the shot noise increases to 10 electrons. This allows for significant relaxation of the ADC read noise without any significant impact to the total noise of the measurement.

Figure 3:
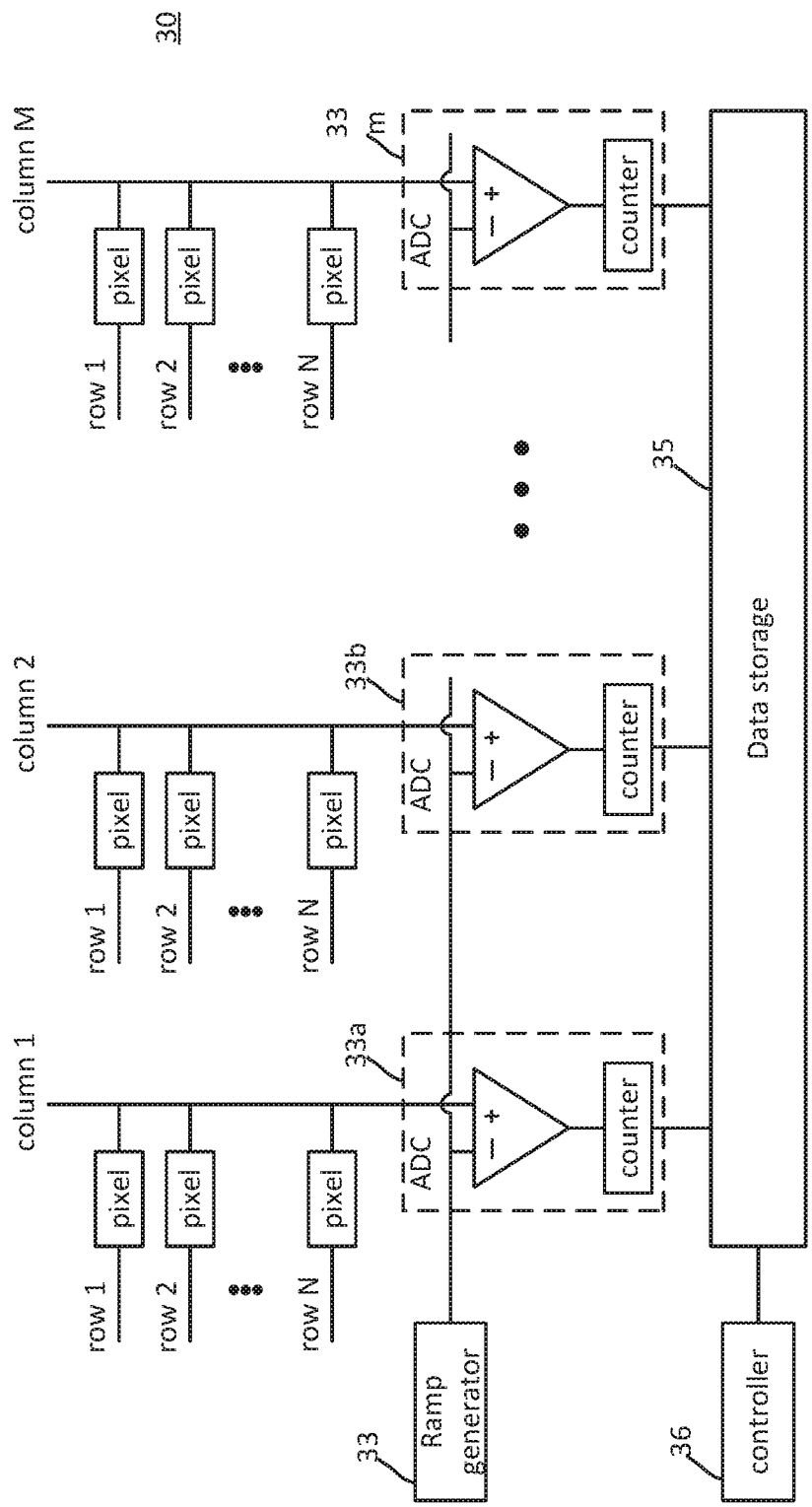
FIG. 3 is a simplified schematic block diagram illustrating an analog-to-digital conversion in an image sensor according to an embodiment of the present disclosure.

FIG. 3 is a simplified schematic block diagram illustrating an analog-to-digital conversion in an image sensor 30 according to an embodiment. Referring to FIG. 3, the image sensor 30 includes a pixel array having N rows of pixels and M columns of pixels, each column is coupled to one of the analog-to-digital converters (ADCs) 33a, 33b, ..., 33m. Each of the ADCs may include a comparator and a counter as shown in FIG. 2. The counters each receive a common clock signal CLK and includes a count value corresponding to an analog pixel signal received from a pixel of an associated column. The count value of each counter is latched into a data storage 35 in response to control signals provided by a controller 36. In some embodiments, the number of ADCs is less than the number of columns in the pixel array such that the ADCs are sequentially shared by the columns.

Figure 4:
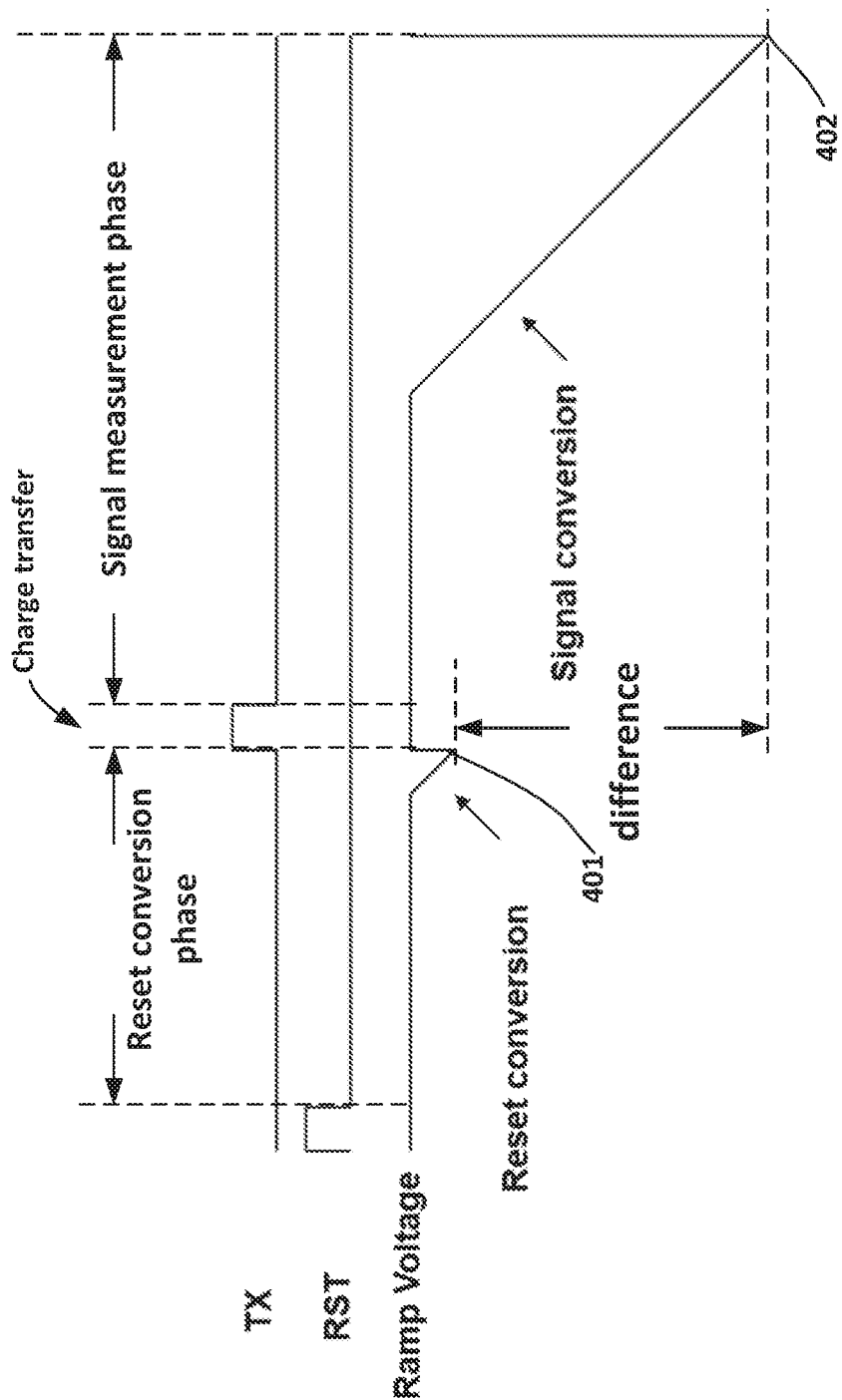
FIG. 4 is a timing diagram illustrating an exemplary pixel readout cycle for describing the basic pixel readout of FIG. 1.

FIG. 4 is a timing diagram illustrating an exemplary pixel readout cycle for describing the basic pixel readout of FIG. 1. Referring to FIG. 4, when the reset transistor RST is turned on (RST signal is asserted high), the floating diffusion node FD is charged with the VDD_RST voltage. The reset transistor RST is then turned off, the value 401 obtained during the reset conversion phase represents the effective value of noise of the readout circuit. When the transfer transistor TX is turned on (TX signal is asserted high), an analog pixel signal 402 indicative of the photons received by the pixel is received by the readout circuit. The transfer transistor TX is then turned off. The analog pixel signal is then measured during the signal conversion phase (signal measurement phase). The difference between the pixel signal 401 in the reset conversion phase and the pixel signal 402 in the signal measurement phase represents the effective voltage value of the analog pixel signal with the noise values of the readout circuit being subtracted from the measured analog pixel signal value.

In accordance with some embodiments of the present invention, two consecutive ramps are provided during both the reset conversion phase and the signal conversion phase (signal measurement phase). In one embodiment, the first ramp is slow and has a limited swing while the second ramp is fast and covers the full range of pixel outputs. For example, the first ramp may be 0.5 V/µs and correspond to a predetermined voltage level or range equivalent on only 400 electrons while the second ramp may be 2 V/µs and correspond to a full scale voltage equivalent to 5000 electrons. Thus, a total of four ADC conversions are performed. To process the output signal of a pixel, a method or circuitry may include determining whether the pixel output signal is safely within the predetermined voltage range of the slower ramp. When the pixel output signal is determined to be within the full-scale range of the slower ramp, the pixel output signal (pixel signal) is determined by the difference of the ADC conversions with the two slow ramps. When the pixel output signal is found not to be within the full-scale range of the slower ramp, the pixel signal is determined by the difference of the ADC conversions with the two faster ramps. The benefit of this scheme is that for pixels with fewer captured electrons, the benefit of the lower read noise can be obtained from the slower ramp while still capturing the full range of pixel outputs. For the faster ramp conversions, the ADC read noise will be considerably higher, but the shot noise of the electron capture process will also be higher, and it is easy to partition the system so the shot noise is always the dominant noise mechanism for the faster ramp conversions while getting the full benefit of a fast and slow ramp. Note that conversions with the faster ramp will count fewer clock cycles for the same number of received electrons compared to the slower ramp, assuming the same frequency clock is used. Thus, the output signal must be multiplied by the ratio of ramp rates for the faster rate conversions to correctly construct an ADC output code that is linear with electron arrival rate.

Figure 5:
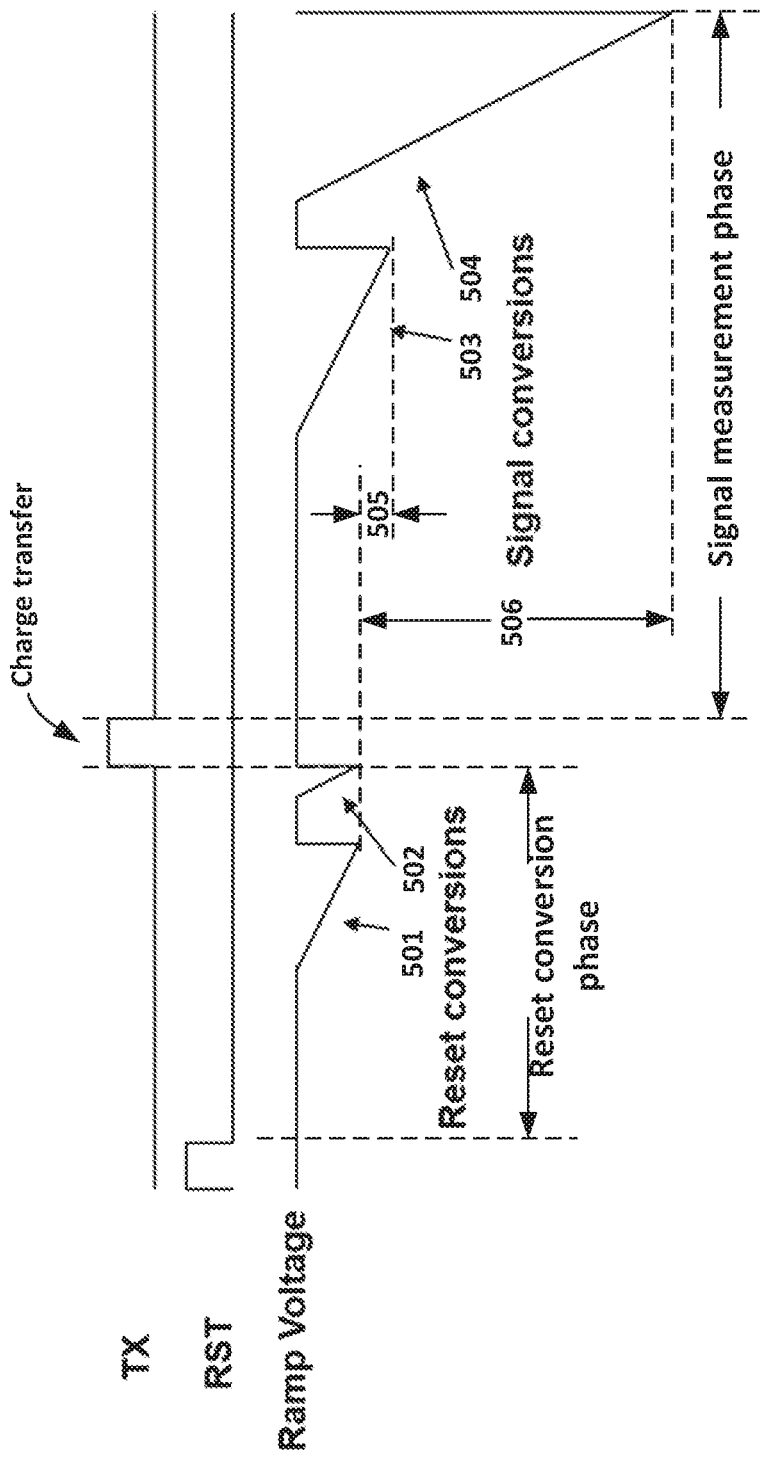
FIG. 5 is a timing diagram illustrating an exemplary pixel readout cycle of FIG. 1 for describing another pixel readout of FIG. 1 according to an embodiment of the present disclosure.

FIG. 5 is a timing diagram illustrating an exemplary pixel readout cycle for describing the pixel readout of FIG. 1 according to an embodiment of the present disclosure. Referring to FIG. 5, when the reset transistor RST is turned on (RST signal is asserted high), the floating diffusion node FD is charged with the VDD_RST voltage. Then the reset transistor RST is turned off. During the reset conversion phase, two consecutive reset conversions are performed: a first reset conversion 501 is performed using a slow ramp signal, followed by a second reset conversion 502 with a fast ramp signal. The values obtained during these two reset conversions in the reset conversion are also referred to as values 501 and 502, respectively. The values 501 and 502 are representative of the noise value of the readout circuit and can have the same value. When the transfer transistor TX is turned on (TX signal is asserted high), an analog pixel signal indicative of the photons received by the pixel is received by the readout circuit. The transfer transistor TX is then turned off. Two consecutive signal conversions are performed on the received analog pixel signal during the signal measurement phase using the slow ramp signal and the fast ramp signal to obtain the converted signal values 503 and 504, respectively. In one embodiment, the readout circuit determines whether the signal converted value 503 using the slow ramp signal is within the predetermined voltage range of the slow ramp. When the signal converted value 503 is found to be within the predetermined voltage range of the slow ramp, the readout circuit computes a difference 505 between the signal converted value 503 and the reset converted value 501 as a digital word, which is representative of the analog pixel signal in a low-light condition. When the readout circuit determines that the converted signal value 503 is not within the predetermined voltage range of the slow ramp, the readout circuit computes a difference 506 between the signal converted value 504 and the reset conversion value 502 using the fast ramp signal. The difference 506 is associated with the effective voltage value of the analog pixel signal with the noise values of the readout circuit removed.

It is noted that the difference 506 is associated with the converted signal value 504, which is measured with the fast ramp signal. Therefore, the converted signal value 504 corresponds to the counter value with fewer clock cycles for the same number of received electrons (photons) compared to the slow ramp, assuming the same frequency clock. In some embodiments, the converted signal 504 using the fast ramp rate is multiplied by a ratio between the fast ramp rate and the slow ramp rate to correctly construct an ADC output code (digital word) that is linear with the electron (photon) arrival rate.

Figure 6:
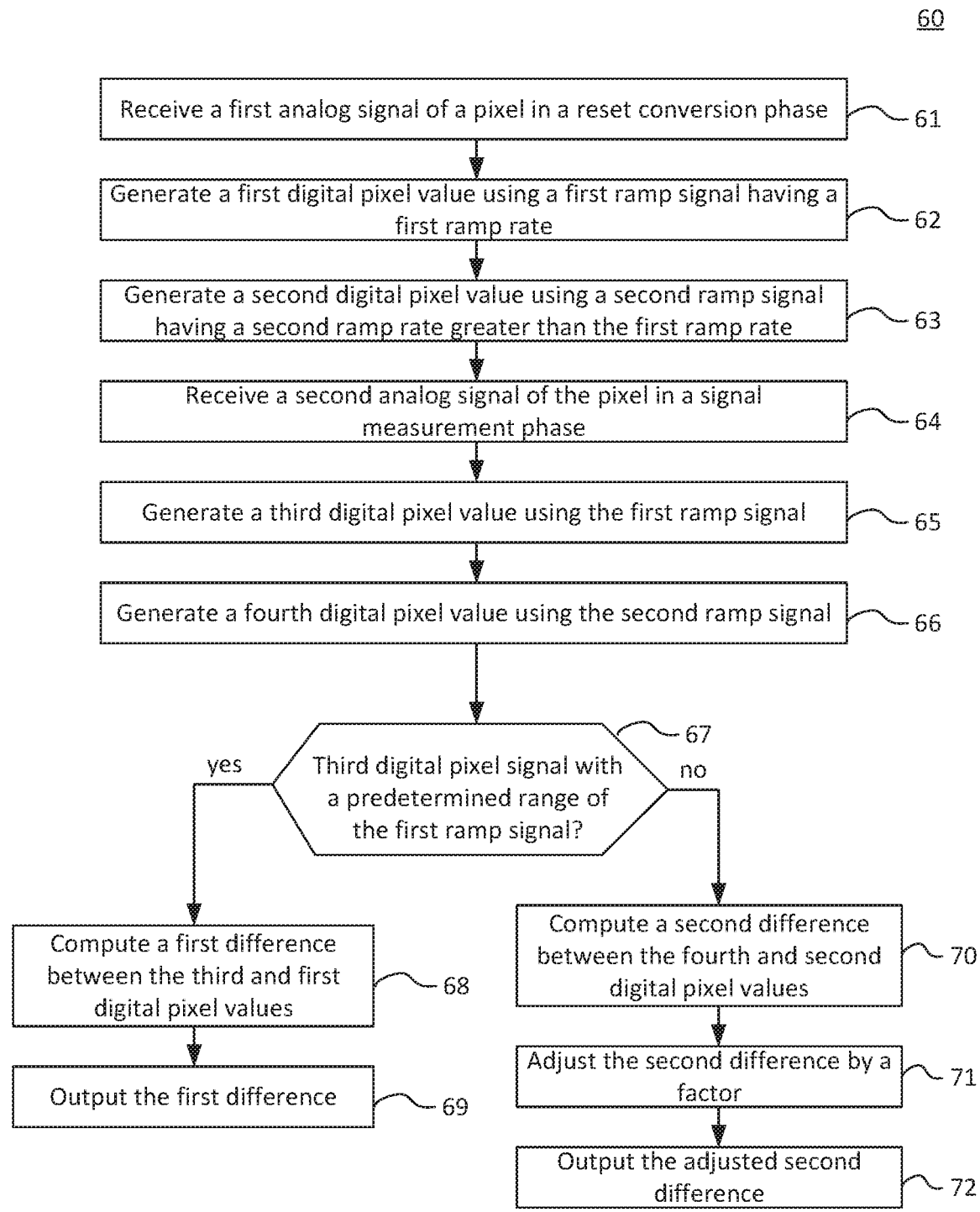
FIG. 6 is a simplified flowchart illustrating a method 60 of operating an integrated-circuit image sensor according to an embodiment of the present disclosure.

FIG. 6 is a simplified flowchart illustrating a method 60 of operating an integrated-circuit image sensor according to an embodiment of the present disclosure. Referring to FIG. 6, the method 60 includes receiving (reading out) a first analog signal of a pixel in a reset conversion phase (step 61), a first digital pixel value representative of the first analog signal is generated (first analog-to-digital conversion) using a first ramp signal having a first ramp rate in step 62, and a second digital pixel value representative of the first analog signal is generated (second analog-to-digital conversion) using a second ramp signal having a second ramp rate greater than the first ramp rate in step 63.

The method 60 also includes receiving (reading out) a second analog signal of the pixel in a signal measurement phase (step 64), a third digital pixel value representative of the second analog signal is generated (third analog-to-digital conversion) using the first ramp signal having the first ramp rate in step 65, and a fourth digital pixel value representative of the second analog signal is generated (fourth analog-to-digital conversion) using the second ramp signal having the second ramp rate in step 66.

The method 60 further includes determining whether the third digital pixel value is within a predetermined voltage range of the slow ramp signal in step 67. In one embodiment, the predetermined voltage range of the slow ramp (first ramp) corresponds to a voltage representative of an electron count in the pixel above which shot noise of the light signal is substantially larger than circuit read noise. For example, the circuit read noise corresponds to 1 electron, the shot noise is about 10 electrons, and the electron count of the pixel is about 100 electrons. When the third digital pixel value is determined to be within the predetermined voltage range of the slow ramp signal (yes in step 67), the method 60 includes obtaining a first difference between the third digital pixel value and the first digital pixel value (step 68), the first difference is representative of a low-light level of the pixel and provided as a digital word to a processor for further processing (step 69). When the third digital pixel value is determined not to be within the predetermined voltage range of the slow ramp signal (no in step 67), the method 60 includes obtaining a second difference between the fourth digital pixel value and the second digital pixel value (step 70), the second difference is associated with a bright-light level of the pixel. In some embodiments, the method 60 may further include adjusting the second difference by an adjustment factor (step 71) prior to outputting the adjusted second difference (step 72). In some embodiments, the adjustment factor may be a ratio between the fast ramp rate and the slow ramp rate.

Figure 7A:
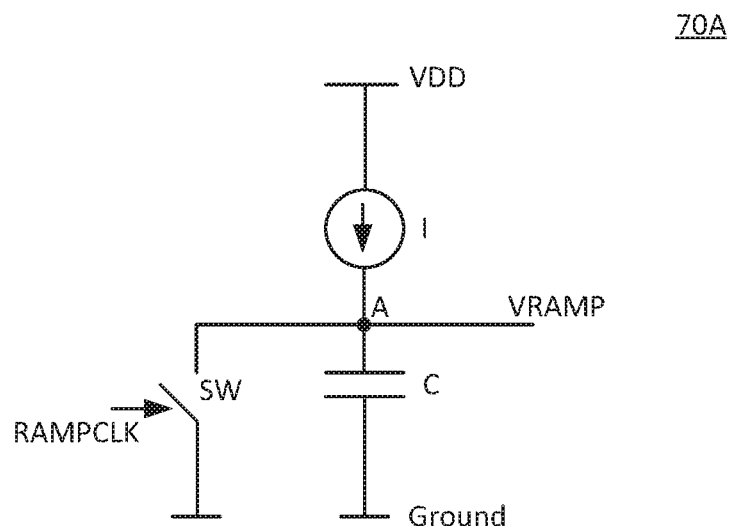
FIG. 7A is a circuit diagram of a ramp generator that can be employed in an embodiment of the present disclosure.

FIG. 7A is a block circuit diagram of a ramp generator 70A that can be employed in an embodiment of the present disclosure. Referring to FIG. 7A, the ramp generator 70A includes a constant-current source labeled I and connected between a positive voltage supply VDD and an output node A, a capacitor C is connected between the output node A and ground, and a switch SW is connected in parallel with the capacitor C. The switch SW is open and closed under the control of a control signal RAMPCLK.

Figure 7B:
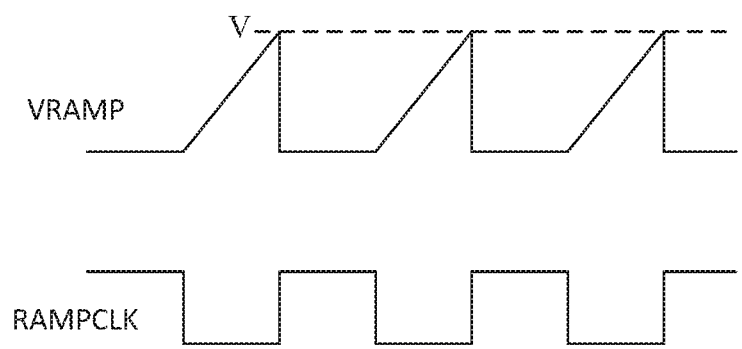
FIG. 7B is an output voltage waveform of the ramp generator of FIG. 7A.

FIG. 7B is an output voltage waveform of the ramp generator of FIG. 7A. When the switch SW is open, the capacitor C is charged by the constant-current source I and provides a voltage VRAMP increasing linearly to a level V, which is a function of the capacitive value of the capacitor C and the current value of the constant-current source I. The voltage VRAMP is discharged to zero when the switch SW is closed. It is noted that the voltage VRAMP is shown as linearly increasing from a low level to a high level, one of skill in the art would appreciated that the voltage VRAMP can have its polarity inverted using circuitry known in the art, such as operational amplifiers, transistors, etc.

Figure 7C:
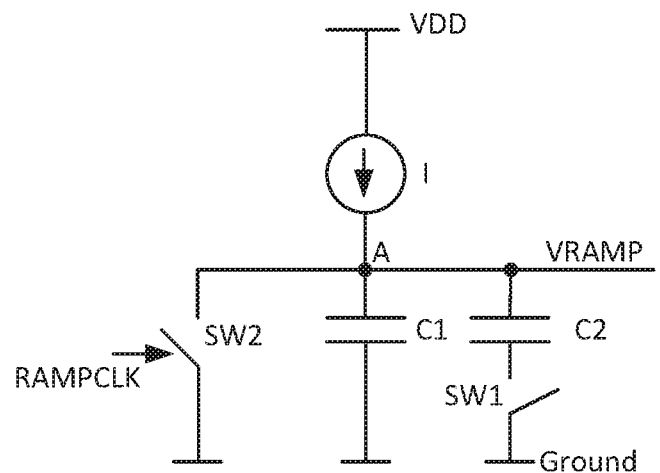
FIG. 7C is a circuit diagram of a dual-ramp generator that can be employed in another embodiment of the present disclosure.

FIG. 7C is a circuit diagram of a ramp generator 70C according to another embodiment of the present disclosure. Referring to FIG. 7C, the ramp generator 70C includes a constant-current source labeled I and connected between a positive voltage supply VDD and an output node A, a first capacitor C1 is connected between the output node A and ground, a second capacitor C2 is connected between the output node and ground via a first switch SW1, and a second switch SW2 is connected in parallel with the first capacitor C1. The first switch SW1 is closed for generating a slow ramp signal and open for generating a fast ramp signal. The second switch SW2 is open and closed under the control of a control signal RAMPCLK to discharge the capacitor C1 and/or capacitor C2.

Figure 7D:
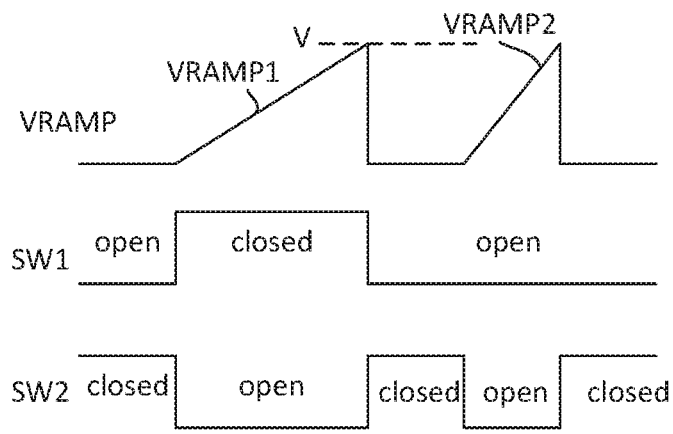
FIG. 7D is an output voltage waveform of the dual-ramp generator of FIG. 7C.

FIG. 7D is an output voltage waveform of the ramp generator 70C of FIG. 7C. For generating a slow ramp signal, the first switch SW1 is closed to connect the first and second capacitors C1 and C2 in parallel. When the second switch SW2 is open, the capacitors C1 and C2 are charged by the constant-current source I and provide a voltage VRAMP1 increasing linearly to a level V with a slow ramp rate, which is a function of the total capacitive value of the first and second capacitors C1 and C2 and the current value of the constant-current source I. The voltage VRAMP1 is discharged to zero when the switch is closed. For a fast ramp signal, the first switch SW1 is open. Only the first capacitor C1 is charged with the constant-current source I, thereby generating a fast ramp signal VRAMP2.

Figure 7E:
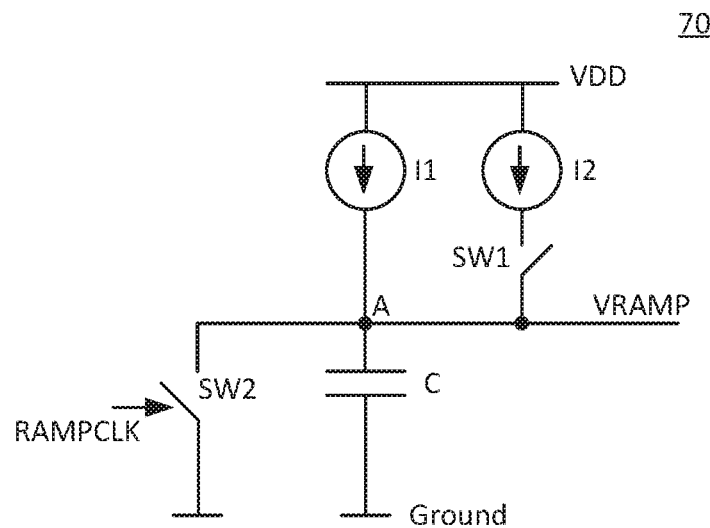
FIG. 7E is a circuit diagram of a dual-ramp generator that can be employed in yet another embodiment of the present disclosure.

FIG. 7E is a circuit diagram of a ramp generator 70E according to yet another embodiment of the present disclosure. Referring to FIG. 7E, the ramp generator 70E includes a first constant-current source labeled I1 and connected between a positive voltage supply VDD and an output node A, a second constant-current source labeled I2 and connected between the positive voltage supply VDD and the output node A via a first switch SW1, a capacitor C is connected between the output node A and ground, and a second switch SW2 is connected in parallel with the capacitor C. For generating a slow ramp signal, the first switch SW1 is open so that the capacitor C is only charged with the first constant-current source labeled I1. For generating a fast ramp signal, the first switch SW1 is close so that the capacitor C is charged with the first and second constant currents I1 and I2. The second switch is open and closed under the control of a control signal RAMPCLK for charging and discharging the capacitor C.

Figure 7F:
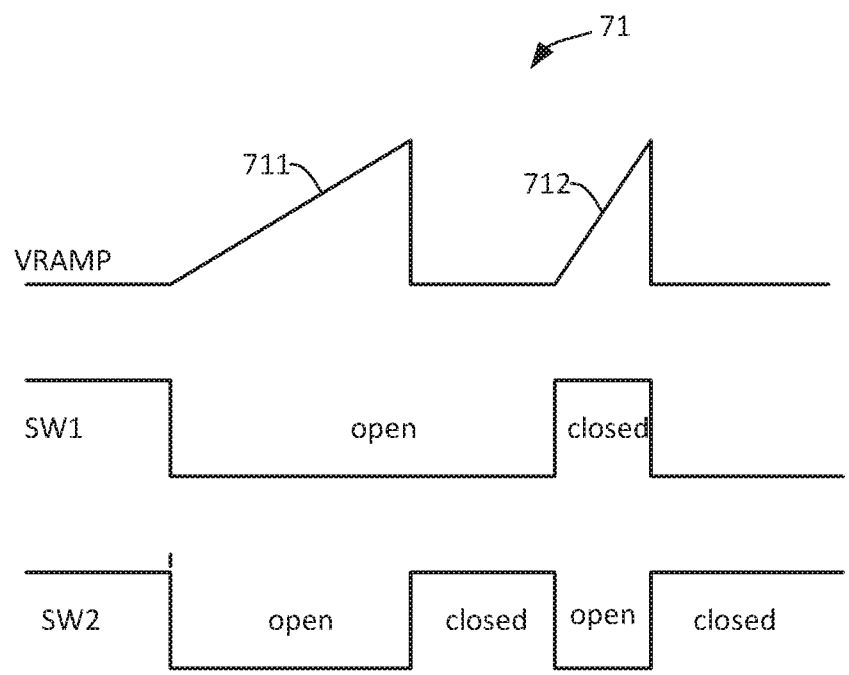
FIG. 7F is a graph illustrating an output voltage ramp signal of the dual-ramp generator of FIG. 7E.

FIG. 7F is a graph illustrating an output voltage ramp signal 71 of the ramp generator 70E of FIG. 7E. The ramp signal 71 includes a slow ramp signal 711 which increases linearly when the first switch SW1 is open so that only first constant current I1 charges the capacitor C to generate the output VRAMP having a slow ramp rate. The linearly increasing slope of the slow ramp signal 711 comes to an end when the second switch SW2 is closed under control of RAMPCLK. The ramp signal 71 also includes a fast ramp signal 712 when the first switch SW1 is closed so that both the first and second constant currents I1 and I2 charge the capacitor C. The time period of the slow and fast ramp signals 711 and 712 can be controlled by a controller.

The structures of the ramp generators shown in FIGS. 7A through 7E are merely an example, and one of skill in the art will understand and appreciate that the structures can be suitably modified as long as similar functions and signal waveforms can be obtained. For example, two ramp generators can be employed to generate the slow ramp signal and the fast ramp signal, and the slow and fast ramp signals can be provided to the analog-to-digital converter via a multiplexer or an analog switch. The ramp signals are shown as waveforms that linearly increase from a low level to a high level over a time period or time interval. The ramps signals can also be inverted using a signal inversion circuit (e.g., operational amplifier, transistor, etc.).

Note that multi-slope ramp schemes have been proposed in the literature, but they run into the problem of comparator delay variability. The comparator delay is a function of ramp slope and it is also a large source of offset in the system. For example, in a sample system with a ramp rate of 1 V/μs, a comparator with an acceptable power consumption may have 30 ns of delay. With 100 μV/electron conversion in the pixel, this corresponds to 5 electrons/ns of ramp. A 30 ns delay corresponds to an offset of 150 electrons. This is a huge offset compared to a read noise target of 1-3 electrons. The only way to mitigate this large offset is by very high quality offset cancellation based on the two ADC conversions. For example, a slower ramp rate of 250 mV/us with the same comparator may lead to a delay of 60 ns, A popular method to attempt a multi-slope ramp conversion is to have a ramp which starts with a slow ramp and then switches to a faster ramp at a certain inflection point. This achieves the noise/full scale range tradeoff benefit of two ramp slopes. Much of the focus of the study of this approach has been on how to create an accurate knee in the ramp slope and to properly associate the time the knee occurs. This is a difficult problem on its own, however, the comparator delay is really an insurmountable hurdle to implementing this scheme effectively. There are two problems that result from the comparator offset and its variability with ramp rate. First, there is a transition period where the comparator delay corresponds to a decision time with influence from both the slower portion of the ramp and the faster portion of the ramp. In order to correctly construct a linear ADC output, it would be necessary to properly model the effective conversion rate from pixel output voltage to comparator decision time based on the relative influence of the two ramp rates. Given the variability of the comparator delay to bias, temperature, supply, voltage and mismatch, this is very difficult to do on an efficient basis and no feasible schemes for a large array have been proposed. The second problem is that the offset of the comparator can only be effectively cancelled using the ADC conversion from the reset phase. In order to get reasonable offset cancellation for the slower ramp, it will be necessary for the reset ramp to also use the slower ramp. The consequence is that the faster ramp will have a large and mostly unknown resulting offset. Again, no feasible or efficient schemes have been found to calibrate or remove this offset. The combination of these two problems is to result in a very large distortion in the final ADC output code during the transition region and a very large offset in the output for pixels where the conversion is primarily dominated by the faster ramp region.

It is possible to partially avoid the distortion around the knee region by using completely separate ramps during the signal capture phase. However, the uncancelled offset with the faster ramp will not be addressed with this approach. Even if the offset is theoretically acceptable at higher pixel levels, it will introduce a very large DNL in the ADC output code at the transition region between pixel outputs captured by the slow ramp versus the faster ramp. It is possible to reduce the peak DNL and by using weighted samples to transition from one set of conversions to the other, but the distortion is so large that the resulting INL peak would still be unacceptable.

The present invention takes advantage of the fact that the only way to avoid unacceptable distortion and offset is to use matching ramps during the reset conversion phase. The present inventors observed that there is considerable flexibility in the ramp design due to the fact that the large array reduces its average contribution to the area or power budget. If the ramp can be quickly set and ramps very fast, the fast reset ramp adds very little overhead to the total conversion time.

Embodiments for implementing the ramp in the signal conversion (measurement) phase are provided. In one embodiment, the pixel signal is measured using two consecutive ramps. In another embodiment, the pixel signal is measured in parallel using two ramps generated in parallel. The parallel approach requires to make a rough estimate of the pixel output voltage before starting either ramp. Since the pixel output signal requires some time to settle, and the signal must settle to a level much more precise than what is required for this coarse decision, this is possible to do without adding time to the total conversion time, but adds complexity to the comparator to perform this operation and select one of two ramp inputs. In theory, this may save total conversion time however. In either implementation, it is still necessary to perform two reset conversions and they must be performed in series since it is not possible to know ahead of time which conversions will be needed to construct the final ADC output.

In yet another embodiment, the reset conversions are performed in parallel during the reset conversion phase as well by adding a second comparator per ADC so that the conversion can be captured with both ramp rates and the same time during both the reset conversion phase and the signal conversion phase. This embodiment trades off additional area and power consumption for the ADC at the benefit of slightly improved total pixel conversion time. To save power and area, the comparator capturing the fast ramp, which is also associated with measuring larger signal from the pixel, may be scaled to smaller area and power compared to the other comparator. This will increase noise, but the shot noise of the signal from the pixel will still be larger in most cases.

While the present inventive concept has been disclosed, it will be appreciated that various modifications and alterations can be made without departing from the scope of the present inventive concept as defined by the following claims.

What is claimed is:

1. A method of operating an integrated-circuit image sensor comprising a pixel array including a plurality of columns of pixels and a plurality of rows of pixels, the method comprising:
   reading out a first analog signal of a pixel in a reset conversion phase;
   performing a first analog-to-digital conversion of the first analog signal with a first ramp having a first ramp rate to obtain a first digital pixel value representing the first analog signal;
   performing a second analog-to-digital conversion of the first analog signal with a second ramp having a second ramp rate greater than the first ramp rate to obtain a second digital pixel value representing the first analog signal;
   reading out a second analog signal of the pixel in a signal measurement phase;
   performing a third analog-to-digital conversion of the second analog signal with the first ramp to obtain a third digital pixel value representing the second analog signal;
   performing a fourth analog-to-digital conversion of the second analog signal with the second ramp to obtain a fourth digital pixel value representing the second analog signal;

determining whether or not the third digital pixel value is within a predetermined range of the first ramp to obtain a determination result; and outputting a digital word in response to the determination result.

2. The method of claim 1, further comprising, after obtaining the determination result:

determining a first difference between the third digital pixel value and the first digital pixel value, the first difference being representative of a low-light level of the pixel, and the digital word being the low-light level of the pixel when the third digital pixel value is determined to be within the predetermined range of the first ramp; or determining a second difference between the fourth digital pixel value and the second digital pixel value, the second difference being representative of a bright-light level of the pixel, and the digital word being the bright-light level of the pixel when the third digital pixel value is determined not to be within the predetermined range of the first ramp.

3. The method of claim 2, further comprising:

adjusting the digital word by an adjustment factor when the digital word is representative of the bright-light level of the pixel.

4. The method of claim 3, wherein the adjustment factor is a ratio between the second ramp rate and the first ramp.

5. The method of claim 1, further comprising:

amplifying the first analog signal and the second analog signal prior to performing the analog-to-digital conversions.

6. The method of claim 1, wherein performing the analog-to-digital conversions comprises employing a same analog-to-digital converter.

7. The method of claim 1, wherein:

performing the first analog-to-digital conversion of the first analog signal with the first ramp comprises:

counting a first number of clocks using a counter during a first time period where a level of the first ramp is greater than a level of the first analog signal; and stopping counting when the level of the first ramp is equal to or lower than the level of the first analog signal, the first counted number of clocks associated with the first digital pixel value;

performing the second analog-to-digital conversion of the first analog signal with the second ramp comprises:

counting a second number of clocks using the counter during a second time period where the level of the second ramp is greater than the level of the first analog signal; and stopping counting when the level of the second ramp is equal to or lower than the level of the first analog signal, the second counted number of clocks associated with the second digital pixel value;

performing the third analog-to-digital conversion of the second analog signal with the first ramp comprises:

counting a third number of clocks using the counter during a third time period where the level of the first ramp is greater than a level of the second analog signal; and stopping counting when the level of the first ramp is equal to or lower than the level of the second analog signal, the third counted number of clocks associated with the third digital pixel value; and performing the fourth analog-to-digital conversion of the second analog signal with the second ramp comprises:

counting a fourth number of clocks using the counter during a fourth time period where the level of the second ramp is greater than the level of the second analog signal; and stopping counting when the level of the second ramp is equal to or lower than the level of the second analog signal, the fourth counted number of clocks associated with the fourth digital pixel value.

8. The method of claim 7, further comprising:

storing the first, second, third, and fourth counter numbers of clocks in a data storage; and resetting the counter.

9. The method of claim 1, wherein the predetermined range of the first ramp corresponds to a voltage representative of an electron count in the pixel above which shot noise of the light signal is much larger than circuit read noise.

10. An integrated-circuit image sensor comprising:

a plurality of pixels arranged in a pixel array arranged in a plurality of pixel columns;

a plurality of readout circuits, each one of the readout circuits coupled to one of the plurality of pixel columns, each one of the readout circuits comprising an analog-to-digital converter (ADC) configured to receive a first analog signal of a pixel in a reset conversion phase and a second analog signal of the pixel in a signal measurement phase;

a dual-ramp generator configured to generate a first ramp having a first ramp rate and a second ramp having a second ramp rate greater than the first ramp rate and provide the first ramp to the plurality of readout circuits in the reset conversion phase and the second ramp to the plurality of readout circuits in the signal measurement phase; and a controller configured to provide control signals to the readout circuits and the dual-ramp generator, wherein the ADC sequentially provides a first digital pixel value representative of the first analog signal based on the first ramp, a second digital pixel value representative of the first analog signal based on the second ramp in the reset conversion phase, a third digital pixel value representative of the second analog signal based on the first ramp, and a fourth digital pixel value representative of the second analog signal based on the second ramp in the signal measurement phase, and wherein the controller is further configured to determine whether the third digital pixel value is within a predetermined range of the first ramp to obtain a determination result, and to output a digital word in response to the determination result.

11. The integrated-circuit image sensor of claim 10, wherein the controller is further configured to:

compute a first difference between the first digital pixel value and the third digital pixel value when the third digital pixel value is determined to be within the predetermined range of the first ramp, wherein the controller is configured to output the digital word to indicate the first difference, which is representative of a low-light level of the pixel.

12. The integrated-circuit image sensor of claim 11, wherein the digital word is a first digital word, and the controller is further configured to:

compute a second difference between the fourth digital pixel value and the second digital pixel value when the third digital pixel value is determined not to be within the predetermined range of the first ramp; and output the second difference as a second digital word, which is representative of a bright-light level of the pixel.

13. The integrated-circuit image sensor of claim 12, wherein the controller is further configured to adjust the second digital word by an adjustment factor.

14. The integrated-circuit image sensor of claim 13, wherein the adjustment factor is a ratio between the second ramp rate and the first ramp rate.

15. The integrated-circuit image sensor of claim 11, wherein the predetermined range of the first ramp corresponds to a full-scale voltage representative of a low-light level of the pixel.

16. The integrated-circuit image sensor of claim 10, wherein the ADC comprises:
 a digital counter configured to count a first number of clocks during a first time interval of the first ramp, a second number of clocks during a second time interval of the second ramp of the first analog signal, a third number of clocks during a third time interval of the first ramp, and a fourth number of clocks during a fourth time interval of the second ramp of the second analog signal, and
 a comparator configured to provide a stop signal to stop the digital counter from counting when the first ramp reaches a level of the first analog signal and the second ramp reaches a level of the second analog signal.

17. The integrated-circuit image sensor of claim 16, wherein the first number of clocks is representative of the first digital pixel value, the second number of clocks is representative of the second digital pixel value, the third number of clocks is representative of the third digital pixel value, and the fourth number of clocks is representative of the fourth digital pixel value.

18. The integrated-circuit image sensor of claim 10, further comprising a storage circuit configured to store the first, second, third, and fourth digital pixel values under control of the controller.

19. The integrated-circuit image sensor of claim 10, wherein the dual-ramp generator comprises:
 a capacitor;
 a first constant-current source coupled to the capacitor at an output node;
 a second constant-current source connected in parallel with the first constant-current source;
 a first switch configured to electrically connect and disconnect the second constant-current source to the output node under control of the controller; and
 a second switch configured to electrically connect the capacitor to ground.

20. The integrated-circuit image sensor of claim 10, wherein the ADC comprises:
 a digital counter configured to count a first number of clocks during a first time interval of the first ramp, a second number of clocks during a second time interval of the second ramp as a function of the first analog signal, a third number of clocks during a third time interval of the first ramp, and a fourth number of clocks during a fourth time interval of the second ramp as a function of the second analog signal,
 a comparator configured to stop the digital counter from counting when the first ramp reaches a level of the first analog signal and the second ramp reaches a level of the second analog signal; and
 a programmable gain amplifier disposed before the comparator.

\* \* \* \* \*